United States Patent
Leussink

(10) Patent No.: US 8,429,338 B2
(45) Date of Patent: Apr. 23, 2013

(54) METHOD AND APPARATUS FOR EMULATING BYTE WISE PROGRAMMABLE FUNCTIONALITY INTO SECTOR WISE ERASABLE MEMORY

(75) Inventor: Steven Frederik Leussink, Utrecht (NL)

(73) Assignee: Dialog Semiconductor B.V., MV's-Hertogenbosch (NL)

( * ) Notice: Subject to any disclaimer, the term of this patent is extended or adjusted under 35 U.S.C. 154(b) by 126 days.

(21) Appl. No.: 12/945,650

(22) Filed: Nov. 12, 2010

(65) Prior Publication Data
US 2011/0119433 A1 May 19, 2011

(30) Foreign Application Priority Data
Nov. 12, 2009 (EP) .................................. 09175829

(51) Int. Cl.
*G06F 12/00* (2006.01)
(52) U.S. Cl.
USPC ...... 711/103; 711/154; 711/156; 365/185.33; 717/138
(58) Field of Classification Search .................. 711/103, 711/154, 156; 365/185.33; 717/138
See application file for complete search history.

(56) References Cited

U.S. PATENT DOCUMENTS

| 6,256,232 | B1 | 7/2001 | Chang et al. | |
|---|---|---|---|---|
| 6,904,400 | B1 | 6/2005 | Peri et al. | |
| 7,058,755 | B2 * | 6/2006 | Nallapa | 711/103 |
| 7,804,713 | B2 * | 9/2010 | Parker | 365/185.03 |
| 8,074,011 | B2 * | 12/2011 | Flynn et al. | 711/103 |
| 2003/0046631 | A1 | 3/2003 | Gappisch et al. | |
| 2005/0055496 | A1 | 3/2005 | Nallapa | |
| 2007/0143528 | A1 | 6/2007 | Przybylek | |
| 2008/0183953 | A1 * | 7/2008 | Flynn et al. | 711/103 |
| 2009/0125671 | A1 * | 5/2009 | Flynn et al. | 711/103 |
| 2010/0250875 | A1 * | 9/2010 | Leung et al. | 711/155 |

OTHER PUBLICATIONS

Search Report for European Patent Application No. 09175829.2-1233, dated Feb. 1, 2010, pp. 1-6.
European Search Report—10190861.4-1233 mail date—Feb. 9, 2011, pp. 1-7.

* cited by examiner

*Primary Examiner* — Stephen Elmore
(74) *Attorney, Agent, or Firm* — Saile Ackerman LLC; Stephen B. Ackerman; Rosemary L. S. Pike

(57) ABSTRACT

A method and system for emulating a byte-wise programmable memory in a sector-wise erasable memory, where emulating a byte-wise programmable memory in a sector-wise erasable memory is based on dividing the sector-wise erasable memory in a plurality of sectors, dividing each of the sectors into several memory locations suitable to store containers, with each container having a header and a payload portion, and storing a data value relating to an application in the payload portion of one of the containers and header information identifying the application in the header in an available container. The containers can be block containers, and the data portion can have two or more payload values. The storing action can be performed in such a way that the two or more payload values in the payload portion together uniquely represent the data value.

26 Claims, 10 Drawing Sheets

Prior Art

METHOD AND APPARATUS FOR EMULATING BYTE WISE PROGRAMMABLE FUNCTIONALITY INTO SECTOR WISE ERASABLE MEMORY

PRIORITY CLAIM

This application claims priority under 35 U.S.C. 119(a) to European Application No. 09175829.2, entitled "METHOD AND APPARATUS FOR EMULATING BYTE WISE PROGRAMMABLE FUNCTIONALITY INTO SECTOR WISE ERASABLE MEMORY," filed Nov. 12, 2009, and which application is herein incorporated by reference.

FIELD OF THE INVENTION

The present invention relates to an apparatus and method for emulating a byte wise programmable functionality into a sector wise erasable memory such as a FLASH memory.

BACKGROUND OF THE INVENTION

Many electronic devices have non-volatile memory connected to a processor to store data. The way data can be stored varies for different non-volatile memories. For instance, EEPROM memories typically allow byte wise programming. A single byte can be erased and reprogrammed. FLASH memories typically allow sector wise programming. In that case, a sector with a minimum sector size (typically 4 kB) must be erased before any single byte can be programmed in the sector. One can not erase and/or modify a previously written single byte in the sector within such (FLASH) memory. In order to modify a single byte, i.e. changing at least one bit from said signal byte from a logical '0' to a logical '1', the entire sector must be read from the (FLASH) memory and stored in a local, other memory (usually RAM) first. After that, the sector is erased in the FLASH memory. The byte that needs to be written is modified in the locally stored sector in the other memory and the entire sector in the FLASH memory is reprogrammed, i.e., the modified sector is transferred from the local other memory to the FLASH memory. So, in a FLASH memory one can only write a single byte to a memory location which has first been erased, and the act of erasing is performed sector wise. In other words, during an erase operation, all bits of a sector of a sector-wise erasable memory are set in an erased state, and during a storing operation one or more bits could only be changed from the erased state to programmed state.

In telephone applications the EEPROM memory is typically used for device settings, telephone books, menu settings and so on. When a user changes a setting, a corresponding data value is stored within a memory structure in for example a byte of the EEPROM, such that said byte contains that setting. The amount of times a byte can be reprogrammed without exceeding the loss of data retention guarantee is typically around 1 Million times for an EEPROM.

As an example, assume the volume setting of a headset in a busy call center is changed 10 times a day, 7 days a week, during the course of 10 years. This means the setting is changed 36.500 times, which is well within the EEPROM specification.

Now suppose the same information is stored in one or more bytes within a FLASH memory. Since a whole sector of the FLASH memory must be read, modified (in an other memory), erased and reprogrammed, this means that this sector is erased 36.500 times due to the desire to store this (these) byte(s) of information only. Suppose the surrounding bytes of that byte in the same sector have a 100 times lower refresh rate (volume setting changes a lot compared to other settings), then still the sector will be reprogrammed a total times of:

36.500(due to volume setting)+(4096−1)*36.500/100
[due to lower refresh rate of other bytes in the sector]=1.531.175 times Given the fact that a typical sector in a FLASH memory may be erased about 10.000-100.000 times, it is clear that the "byte wise write" functionality of EEPROM memory can not be implemented in FLASH memory in a straightforward way.

In the prior art, several algorithms have been developed to emulate an EEPROM memory functionality into a FLASH memory. The goal of this emulation is to realize a cost saving by integrating the EEPROM memory functionality into the FLASH memory. In this way there is no need for a FLASH memory and an EEPROM memory together, but the system can suffice with just a FLASH memory. Even if a FLASH memory has more memory locations than an EEPROM memory it is considerably cheaper.

As an example, as shown in FIG. 1, assume an EEPROM memory 4 and a FLASH memory 3. The EEPROM memory 4 is 4 kB large in size. Typical prior art emulation systems allocate a larger memory space in FLASH memory 3, for instance 64 kB to emulate the 4 kB EEPROM memory 4 as is depicted in FIG. 1. The EEPROM memory 4 is divided into eight blocks 1 of 512 bytes. Each block 1 is represented by two sectors 2 and 5 in the FLASH memory 3. The sector 2 is active and the sector 5 is inactive. When the active sector 2 is full, the data in active sector 2 must be read out and stored in another, inactive sector 5 in order to prepare for erasing said active sector 2 later. Sector 5 operates as a backup memory for the data stored in active sector 2. In this way the reading, erasing, modifying and writing procedure can be restarted even if the system power is lost during the sequence and the locally, elsewhere stored contents of active sector 2 is lost since the backup data as stored in sector 5 can be used for that purpose.

As will be explained in detail below, more memory space is allocated in the FLASH memory 3 to store a certain amount of data, i.e., effectively every byte to be stored has multiple bytes allocated to it in the FLASH memory 3.

Prior art algorithms typically use the mechanism depicted in FIG. 2 to write data 14 to an allocated memory space 16 in the FLASH memory 3. If the software running on the processor requests the FLASH memory 3 to perform a byte write to a certain address in the emulated EEPROM, the prior art algorithms place a container 15 in the corresponding allocated sector in the FLASH memory 3. A container is a continuous part of memory space with a predetermined length in a sector. The container 15 consists of an address portion 13 and data portion 14. The data portion contains the data to be written to the FLASH memory 3. These containers 15 can be placed in any free container 12 in memory space 16. When the free container 12 is written, it is marked as a full container 11.

It is observed that writing data to a free container 12 in FLASH memory sector 16 can be done without having to erase the whole sector, as the empty container 12 has not been previously written. At the beginning of writing data in this sector the whole sector is erased, i.e., all bits are made logical "1". After erasing a sector, all bits within a sector are in an erased state. This allows for a byte wise writing of all available erased bytes once within the FLASH memory directly without the need for such an erasing action. The bits that are changed from a logical "1" to a logical "0" due to the byte wise writing are in a programmed state.

When one of the active FLASH memory sectors is full, the processor will start a defragmentation process which may comprise the following actions:

- The processor starts a sector reading action in which it reads all containers 15 as stored in the whole sector one-by-one in reverse order, i.e., the last stored container 15 is read first,
- For every container 15, the processor checks the value of the address portion 13,
- The processor checks whether it has read the value of the address portion in this sector reading action before,
  - If yes, it ignores the presently read container 15 [because the content of the present container 15 relates to old, invalid data] and continues reading a next container 15,
  - If no, it stores the presently read container 15 in a local memory (e.g. RAM) and continues reading a next container 15,
- After finishing reading the whole sector in this way, the processor stores all containers 15 stored in local memory in a new sector in FLASH memory 3, which new sector has been erased before,
- The processor erases the (old) sector.

If the new sector is full the processor repeats the above actions but then the functions of the old and new sector are reversed. So, after defragmenting the content of the new sector, and storing defragmented data in local memory, the defragmented data is transferred from local memory to the old sector. Since the allocated sector in FLASH memory is large enough for storing data for a predetermined number of addresses this process can continue without the FLASH memory getting completely full.

In the prior art embodiment of FIG. 2, the address portion 13 of the container 12 has a one-to-one relation with one item, e.g., the volume setting of one headset of a set of headsets. Every time a new volume setting of the headset needs to be stored this is stored in the data byte 14 of a (new) container 15 in which the address byte 13 equals the address associated with the volume setting of this specific headset. Consequently, the FLASH memory 3 may comprise a plurality of containers 15 having the same address byte 13. The latest stored container 15 with this address, then, has the most recently stored volume setting. So, if the processor has to find the latest stored volume setting it has to look for the latest stored container 15 with this address.

One easy way to store new containers 15 would be to store every new container 15 in a consecutive next free part of the FLASH memory space 16. This may be called a "stack organization".

The prior art method of retrieving a container 15 is illustrated in FIG. 3. To find a container 15 with a specific value in address 13 the containers as stored in FLASH memory 3 are read out in reverse order shown by arrow 17. Every dot 18 in the arrow 17 depicts a read action. Once the system has found the first container 15 with the specific address 13 value in a memory location, indicated with reference number 19 in FIG. 3, it has automatically found the latest data as the latest container will have been stored last in the FLASH memory space 16. Note that on average the system will read out half of the FLASH memory space 16 to find a container 15.

As an example, assume every container 15 consists of a 2 bytes address portion 13 and a 1 byte data portion 14. This means the total length of the container 15 is 3 bytes, so there are (4 kB/sector)/(3 B/container)=1365 containers/sector. So there are 1365 containers 15 available in the sector 16. As depicted in FIG. 1, 512 bytes of block 1 are mapped onto one active sector 2. So there are 1365 containers available for 512 bytes=2.66 containers/byte. As every container 15 can be written once, this means every byte of data can be stored 2.66 times on average in FLASH memory 3 before the 4 kB sector 16 is full.

Recalling the example of the headset application in a busy call centre, if, during the EEPROM lifetime, every byte is on average rewritten 36.500 times, then, on average, each FLASH memory sector 16 will be erased 36.500×/2.66=~13.750 times. This is within specification for certain FLASH memories.

In order to retrieve a byte, the prior art algorithm must read out the entire sector 16 of the FLASH memory 3 until the last written data with a matching address is found. Assuming the data has been uniformly randomly written to FLASH memory 3 this means that on average a ½ sector must be read before the correct byte is allocated.

SUMMARY OF THE INVENTION

The invention relates to a method as defined in claim 1 and an apparatus as defined in claim 13.

Moreover, the invention relates to a computer program product as defined in claim 14 and a data carrier as defined in claim 15.

The invention proposes a new way of organizing a memory with emulating information from a byte wise programmable memory into a sector wise programmable memory.

The object of the invention is to improve at least one of the following:
- The number of times a data value can be written to an allocated memory per unit of the allocated memory.
- The reading speed of the algorithm.
- The writing speed of the algorithm.

It should be noted that US2005/0055496A1 describes a method of indicating which segments, bytes or bits are used by having a pointer at a fixed location and flipping bits of this pointer. Every time a bit is flipped, this indicates that a following segment is used. Said document does not disclose how to fill a segment to represent the data value to be written.

BRIEF DESCRIPTION OF THE DRAWINGS

The invention will be explained in detail with reference to some drawings that are only intended to show embodiments of the invention and not to limit the scope. The scope of the invention is defined in the annexed claims and by its technical equivalents.

DETAILED DESCRIPTION OF EMBODIMENTS

Figure 1:
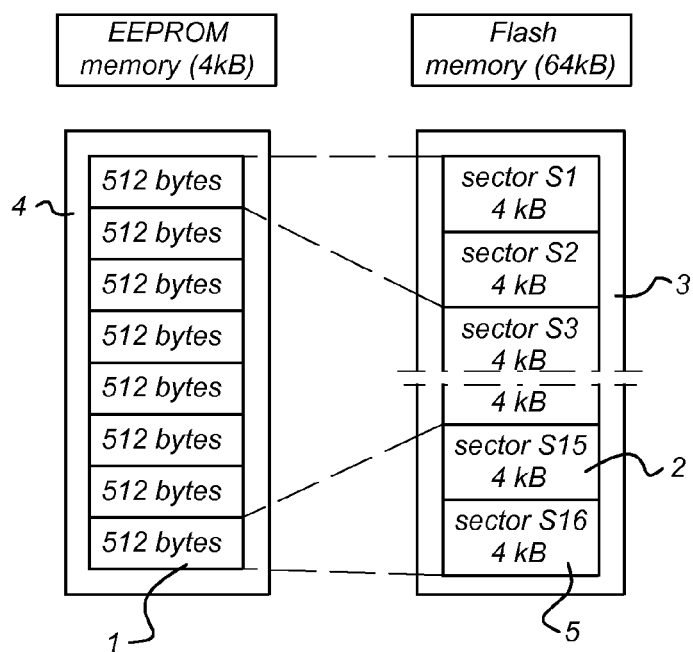
FIG. 1 is a prior art example of emulating an EEPROM memory into a FLASH memory.
Figure 2:
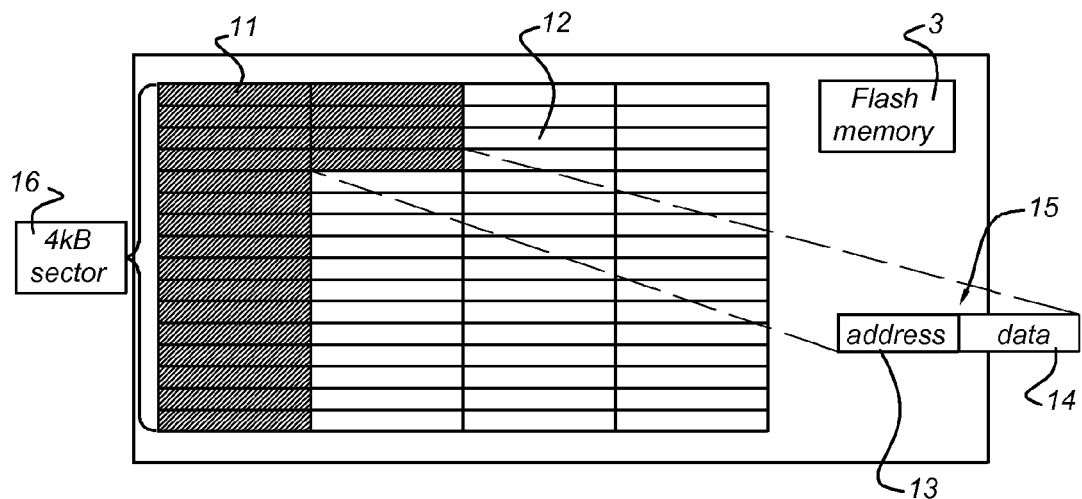
FIG. 2 is a prior art example of a FLASH memory organization.
Figure 5:
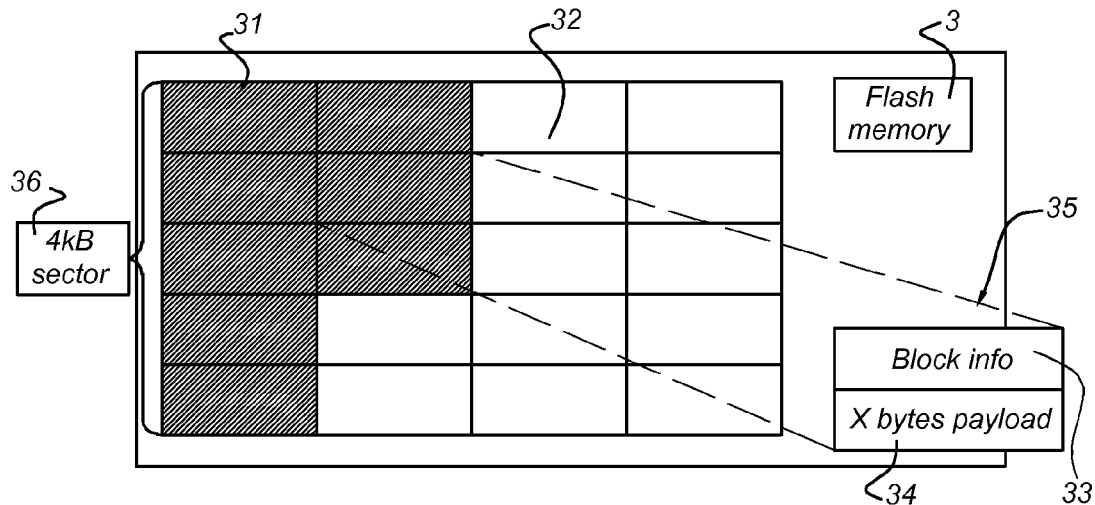
FIG. 5 is an example of a FLASH memory organization according to the invention.

In FIG. 5 and following, the same reference numbers as shown in FIGS. 1 and 2 refer to the same features.

FIG. 5 illustrates a proposed way of organizing the memory. It is assumed that a data value could be represented by eight bits or a byte. Each data value that would have been stored in the EEPROM memory 4 is represented by a block container 35, consisting of a block information portion (or header) 33 and a payload portion 34. In the prior art systems (FIG. 2) a certain data value of a byte in the EEPROM memory 4 corresponds with the data value of the data 14 in the corresponding container 15 in the FLASH memory 3. In the block container 35, however, every block container has two or more payload bytes (=8 Bits) (or, more generally, two or more payload parts) for storing data. Other possible embodiments of payload parts are: nibble (WL=4 Bits), word (WL=16 Bits), longword/doubleword (WL=32 Bits), quadword (WL=64 Bits) octaword (WL=128 Bits). In principle, a payload part could be in the form of WL-bits, wherein WL is the length in bits needed to represent at least all possible data values. In an advantageous embodiment, the payload part has a length of P-bits which corresponds to the number of bits necessary to represent the data value to be stored in and represented by the payload portion 34. The continuous part of memory space allocated for a payload portion 34 has a length of M-bits, wherein M is a multiple of the length of P-bits of a payload part. Moreover, as will be explained in detail below, in the solution according to the invention a data value represented by a byte value to be stored is not stored itself, but is equal to the output of a function which has the payload portion 34 as an input of said function. In other words, the payload portion 34 represents the value of the data value to be stored in a predetermined and unique way. This function that is to be used to derive the byte value representing the data value to be stored from the payload portion 34 can be a variety of functions such as SUM, EXOR, XOR, AND, and any types of combination thereof. However, the SUM function is preferred.

The prior art example has two bytes in the address portion 13 and one byte in the data portion 14 per container 15, yielding 1365 containers per 4 kB sector 16. This means a single byte can be written to the 4 kB sector a total of 1365 times.

The proposed invention could have two or more than two bytes of address overhead as block information portion 33 per block container 35. Assume, for example, the number of bytes per payload portion 34 is six bytes, and the number of bytes per block information portion 33 is two bytes, which yields each block container 35 having a size of 8 bytes.

So, in principle every block container 35 has six bytes, i.e. payload parts, available for storing an 8-bit data value against a certain address as specified in the block information portion 33. So, e.g., a volume setting of a headset could be stored a maximum number of six times at consecutive bytes in the payload portion 34 before all bytes have been used once. However, the processor does not keep track of which byte is written last and does not know which byte has the latest valid data, which is a problem for both reading and writing.

The invention solves this problem by introducing a function scheme used to store data, i.e. a data value, in said block container 35. By doing so, the block container 35 can even be used multiple times to store a new value. For instance, assume the FLASH memory 3 should store a certain byte value. In the context of the present invention a byte value is a data value that is represented by the 8 bits of a byte. Then, in accordance with the invention, this byte value will be represented by the values of the six payload bytes 34 such that it equals an output byte value $B_{output}$ of a predetermined function performed on these six payload bytes 34. The function that maps the six bytes in the payload portion 34 to the output byte value $B_{output}$ is, for instance, the following:

$$B_{output} = \mod(\Sigma_i B_{input,i}, 2^\wedge 8) \quad (1)$$
$$= \mod(\Sigma_i B_{input,i}, 256),$$

Where:
$B \in \{0, 255\}$
$B_{output}$=output byte value
$B_{input,i}$=i-th byte of the payload portion 34, i=1, 2, ..., 6

The way a byte is represented by the payload bytes 34 can also be written as follows if the payload bytes 34 are seen as an array of bits, where j is the bit number (j=0-7) in a specific byte and i is the byte number in the series of payload bytes 34 (i=0-N, N+1=number of bytes used):

$$B_{output} = \mod(\Sigma_j \Sigma_i (b_{input,i,j} * 2^j), 256) = \mod((2^7 \cdot \Sigma_i b_{input,i,7} + 2^6 \cdot \Sigma_i b_{input,i,6} + 2^5 \cdot \Sigma_i b_{input,i,5} + 2^4 \cdot \Sigma_i b_{input,i,4} \ldots + 2^3 \cdot \Sigma_i b_{input,i,3} + 2^2 \cdot \Sigma_i b_{input,i,2} + 2^1 \cdot \Sigma_i b_{input,i,1} + 2^0 \cdot \Sigma_i b_{input,i,0}), 256)$$

where:
$B_{output}$=output byte value
$b_{input, i,j}$=bit value of j-th bit in i-th byte in payload byte series $B_{output}$ itself can also be written as $\Sigma_j (b_{output,j} * 2^j)$, where $b_{output,j}$ is the value of the j-th bit of $B_{output}$.

The following example format is for a payload of six bytes (N=5) in a container 35:

| $0_{5,7}$ | $1_{5,6}$ | $0_{5,5}$ | $0_{5,4}$ | $1_{5,3}$ | $0_{5,2}$ | $0_{5,1}$ | $1_{5,0}$ |
|---|---|---|---|---|---|---|---|
| $1_{4,7}$ | $1_{4,6}$ | $1_{4,5}$ | $1_{4,4}$ | $1_{4,3}$ | $1_{4,2}$ | $0_{4,1}$ | $0_{4,0}$ |
| ... | | | | | | | |
| $0_{1,7}$ | $1_{1,6}$ | $0_{1,5}$ | $0_{1,4}$ | $1_{1,3}$ | $0_{1,2}$ | $0_{1,1}$ | $1_{1,0}$ |
| $0_{0,7}$ | $1_{0,6}$ | $0_{0,5}$ | $0_{0,4}$ | $1_{0,3}$ | $0_{0,2}$ | $0_{0,1}$ | $1_{0,0}$ |

Since each input byte $B_{input, i}$, i.e. payload part, has 256 possible values and $B_{output}$ also has 256 possible values every $B_{output}$ value can be created by changing no more than just one $B_{input,i}$ value. This means that if every $B_{input,i}$ byte can be written once, every block container 35 can be used at least six times to represent 6 different $B_{output}$ values before being "full" (i.e. no $B_{input,i}$ byte is available anymore to modify). This indicates that, on average, the function scheme used in the invention decreases the number of times each sector in FLASH memory 3 must be erased because each block container 35 can at least store one byte data for more than six times. In this example, there are 4096 B/8 B=512 containers 35 per 4 kB sector 36 available and 6 data bytes can be written per container. This means a single byte can be written to the 4 kB sector a total of 512*6=3072 times. The number of times a single byte can be written to the emulated bite wise programmable memory is (3072/1365)*100%=225% better per unit allocated memory than the prior art mechanism as explained with reference to FIG. 2.

After one block container 35 is "full", a new data byte can be stored in another block container in the same sector 36 which physically (stack organization) or logically (pointer organization) follows said fully filled block container 35.

After one sector 36 is full, said sector 36 is automatically erased, i.e. all bits in the sector 36 are set to logical '1', which means all bytes are 0xFF (hexadecimal). The data information can be either stored in the first block container of said erased sector 36 or stored in the first block container of another sector which physically (stack organization) or logically (pointer organization) follows the erased sector 36.

The number of subsequent different data values that can be stored and represented by the payload parts of a payload portion 34 directly determines the number of times the sector 36 in the FLASH memory 3 must be erased (and thus the durability). Therefore this number must be maximized.

After a FLASH memory sector 36 is erased, all bits in the FLASH memory sector 36 are set to logical '1', which means all bytes are 0xFF (hexadecimal). In FLASH memory 3, logical '1's can be programmed to be logical '0', but logical '0's can not be made to logical '1' (requires a full sector erase). So, as long as one only changes a logical "1" into a logical "0" it is not necessary to erase a whole sector 36 but it suffices to change the identified bits from a logical value "1" to "0" within the data portion of the block container itself. The durability of the FLASH memory 3 is only determined by the number of times a sector is erased. Changing a logical '1' into a logical '0' does not reduce the number of cycles the FLASH memory 3 can still be erased before not meeting the data retention specification. This fact is used in the present invention. In theory, the memory space to store a byte, could be used to store subsequently eight difference data values. An exemplar sequence of data values is: 11111111, 1111 1110, 11111100, 1111 1000, 1111 0000, 0111 0000, 0011 0000, 0010 0000 and 0000 0000. The present invention takes advantage of this mechanism that a byte could be programmed more then once before it is erased as long as only one or more bits of a byte could be changed from erased state (logical "1") to programmed state (logical "0") to store a subsequent value in said byte.

Figure 6:
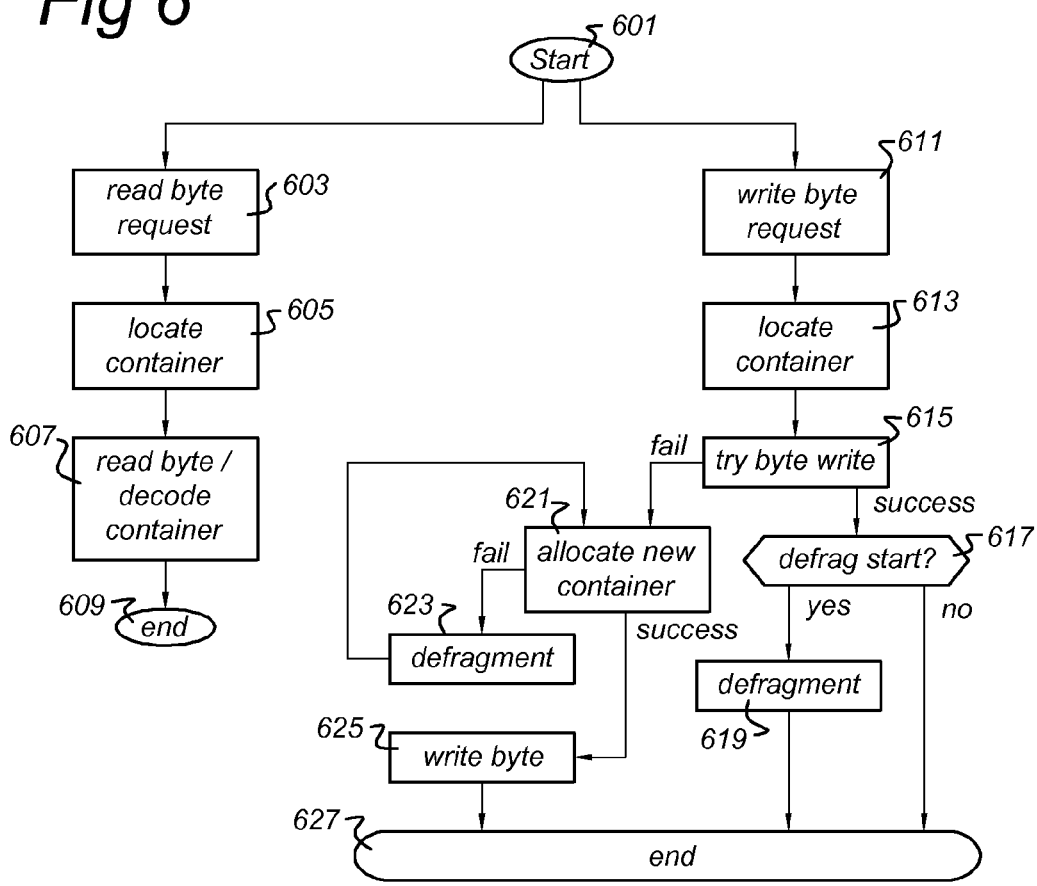
FIG. 6 shows a high level flow chart of an example of a read and write protocol in accordance with the invention.

FIG. 6 shows an example of main actions in a flow chart associated with a computer program (or hardwired logic) to be run by a processor in accordance with the invention. The flow chart shows both the reading from and writing to the FLASH memory 3.

The program starts in action 601. Depending on whether the system has to perform either a read action or write action, it jumps to either action 603 or 611.

In action 603, the system receives a read request. After having received that request it locates the block container 35 from which the data has to be read, action 605.

The mechanism to do so depends on whether a stack organization or a pointer organization is used, as explained above. In action 607 the system reads the payload from the located block container 35 and, if required, decodes its content. It then uses the (decoded) value to perform a predetermined action, like setting a headphone volume to a level corresponding to the read value. This branch of the flow chart ends in action 609.

In action 611, the system receives a byte write request. In action 613, the system locates the block container 35 which payload portion has been written the last time to represent the 8-bit data value of the corresponding application. It checks whether it is possible to write the payload portion such that it can represent another 8-bit data value of the corresponding application, in other words to write a byte again in the payload of this block container 35, action 615. This action 615 will be explained in detail with reference to FIG. 7. If such a byte write cannot be done anymore in the located block container 35 the system jumps to action 621. If the byte write is successful, the system jumps to action 617.

After the system has identified that no byte write is possible anymore in the located block container 35 (action 615), the system tries to allocate a new block container 35 that can be used to write the byte to, action 621. If it successfully identifies such a new block container 35 it writes the byte to that block container 35, action 625. Such a new block container 35 will be an unused block container within an active sector. All bits in such an unused block container will have a logical value '1' due to an earlier erasing action of the entire sector. Therefore to write data to such an unused block container the system does not need a sector erase anymore. It suffices to write the byte to the identified block container 35 and leave all other memory space of the active sector unchanged.

If action 621 fails, i.e. no new block container 35 can be located in the active sector, active sector is full and the system jumps to action 623 in which it defragments the data in the full sector. The way how this may be done is explained below with reference to FIG. 9. After the defragmentation, the active sector concerned is entirely erased and the defragmented data is stored in another, new sector. That new sector comprises enough empty space to store a new block container 35. The system jumps back to action 621 and identifies a new empty block container 35 in the new sector. It then jumps to action 625 and writes the byte to the located new block container 35. Write the byte to the located new block container means that the byte values for each of the bytes (=payload part) of a payload portion are calculated such that the payload portion as a whole represents the 8-bit data value and subsequently write all payload parts of a payload portion in the memory.

After action 625, the system jumps to its end, action 627.

If, in action 615, the system has identified that the byte, i.e. data value, to be written is successfully written to the payload portion of block container 35 as identified in action 613, the system jumps to action 617. In action 617, the system checks whether it has to start a defragmentation action. Depending on system characteristics the system may have various conditions to start defragmentation. The system may keep track of the number of written containers in a sector to start defragmentation when the last container is written. It can also start defragmentation after it detects no new container can be allocated, which requires the defragmentation to take place before writing said container. If the system decides to do defragmentation it jumps to action 619.

Figure 7:
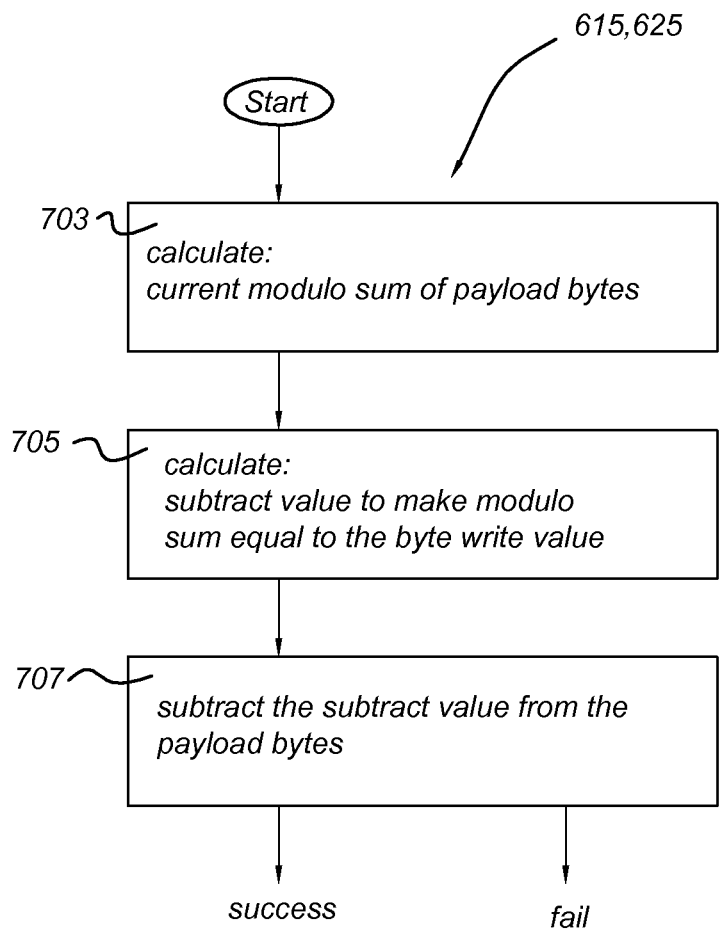
FIG. 7 shows an example of a protocol used to store a data value in a payload portion of a block container in accordance with the invention.

FIG. 7 shows a high level flow chart of actions performed by the system to (try to) write a byte to a block container 35 (actions 615/625 of FIG. 6). This high level flow chart of actions includes the following actions:
  reading stored payload data from the payload portion of a container;
  calculating new payload data in dependence of the data value to be stored and the stored payload data read in the previous action; and
  storing the new payload data in the payload portion of said container.

After its start, action 701, the system calculates a current modulo sum of the payload bytes 34 of the block container 35 located in action 613/621. It uses equation (1) to that effect.

In action 705, the system calculates a subtract value $B_{subtract}$ indicating how much must be subtracted from the current modulo sum to make the current modulo sum equal to the new byte value to be stored, i.e., the new $B_{output}$ (e.g. a new setting of the volume of a headset that has to be stored).

In action 707, the system checks whether the value of the current module sum of the block container 35 contains sufficient '1' bits to allow subtract byte $B_{subtract}$ to be subtracted from it. How this check may be performed will be explained in detail below with reference to FIG. 8. If so, it does so and the subtraction is successful. After this action, the payload bytes represent the latest byte value to be stored. Again, this can be performed by changing only logical '1's into logical '0's. And, again, this action does not require a full sector erase but can be performed directly within the payload portion of the block container concerned in FLASH memory 3. However, if no subtraction is possible, the subtraction failed. It is observed that if the actions of FIG. 7 reflect action 625 of FIG. 6, the outcome will always be successful. However, if it reflects action 615 of FIG. 6, the outcome may be either successful or unsuccessful.

Figure 8:
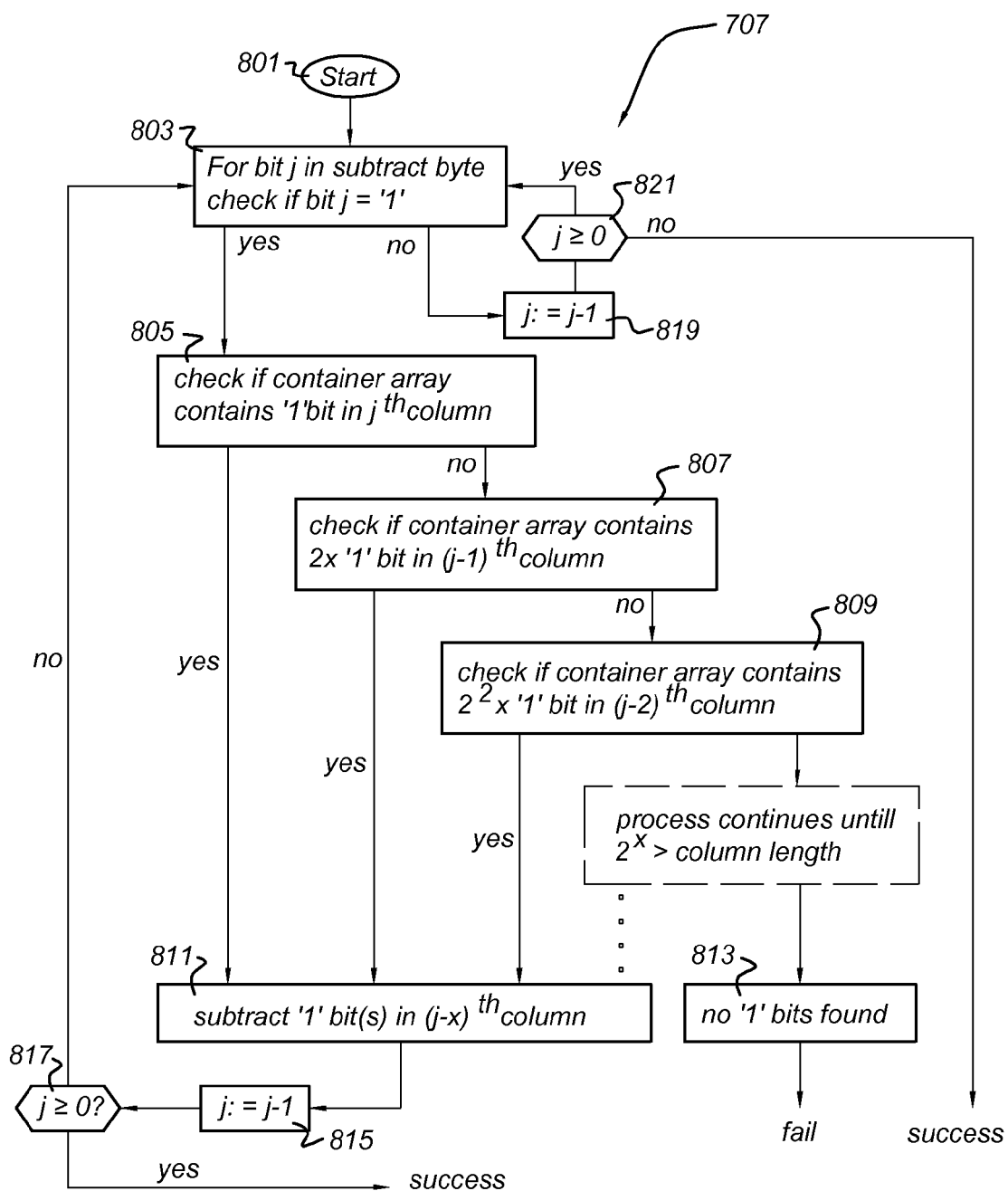
FIG. 8 shows detailed actions of one of the actions in the flow chart of FIG. 7.

FIG. 8 shows an example of action 707, i.e. an attempt by the system to subtract the calculated subtract value $B_{subtract}$ from the payload bytes 34.

In action 803, the system checks for bit $b_{subtract,j}$ in subtract byte $B_{subtract}$ if its value is '1'. It starts with the highest available number of j: so, j=7 at the beginning if $B_{subtract}$ has 8 bits. If the check is negative, it subtracts '1' from j, action 819. It checks, action 821, if j is still larger than or equal to '0'. If yes, it jumps back to action 803. If j is below '0', the system ends the subtract action.

If for the current value of j the system identifies the value of the bit $b_{subtract,j}$ to be '1', it checks, action 805, whether there is any bit $b_{input,i,j}$ with a value of '1' in the position j left in the payload byte array 34. If so, the system jumps to action 811 and subtracts '1' of $b_{input,i,j}$ in the position j from the byte identified in this way in the payload byte series.

However, it none of these bits $b_{input,i,j}$ comprises a '1' (then $b_{input,i,j}=0$ for all i), the system checks if there are any two bits with value of '1' in the position j−1 from the payload byte array 34, action 807. If so, the system subtracts two times a value '1' from $b_{input,j-1}$ for two values of identified in this way, action 811.

However, if in action 807, the system identifies that $b_{input,i,j-1}$ does not contain two additional '1' bits, the system jumps to action 809. In action 809, the system checks if there are any four bits with a value of '1' in the position j−2. If so, the system subtracts '1' from all the identified four positions j−2.

If not successful in action 809, the system continues trying to subtract a value '1' from eight identified '1' values for j−3, provided there are eight bytes available in the payload series 34, etc. If no more '1' bits can be found or an inadequate number of '1' bits are available, the block container 35 is considered to be "full" and a new block container must be allocated (action 621 in FIG. 6).

If the bit $b_{subtract,j}$ with value '1' results in a successful subtraction in the payload byte series 34, action 811, the system subtracts '1' from j, action 815. If j is still larger than or equal to '0', the system jumps back to action 803.

By using the algorithm of FIG. 8, the maximum number of times a byte can be represented is at least N times for N payload bytes 34.

Figure 9:
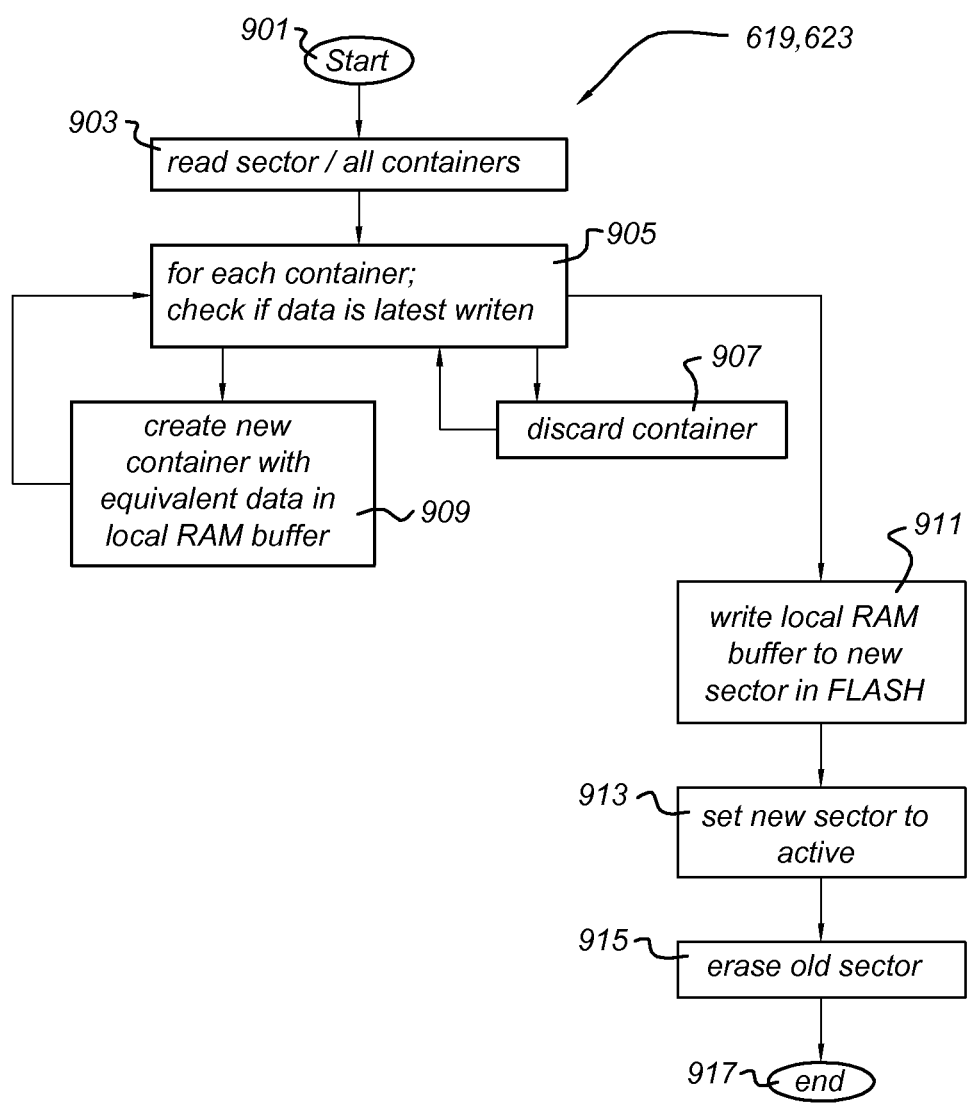
FIG. 9 shows a flow chart with actions in defragmentation process.

FIG. 9 shows an example of a flow chart with actions of a defragmentation process of a FLASH sector which does not contain any empty block container anymore (action 619 or 623 of FIG. 6).

The defragmentation starts in action 901. It performs the defragmentation for all block containers 35 in the sector concerned, as indicated in block 903.

For every block container 35, the system checks if the data in the payload 34 contains the latest written data for the application concerned, action 905. As explained above, the system can perform this check by evaluating the content of the status portion in the header 33. If the data in the payload 34 is the latest written data that container need be maintained and is copied to a local memory, e.g., a RAM buffer, action 909. If the system establishes, however, that the data in the payload 34 is not the latest written data the data is invalid and the block container 35 is discarded, i.e., no copy is stored in the local memory, action 907.

After finishing the actions 905, 907 and 909, the system identifies a new, erased sector in FLASH memory 3. It, then, writes all data as stored in the local memory to that new sector, as indicated in block 911. Since many block containers 35 in the old sector will not have been stored in the local memory because of not containing valid data in payload 34, after this write action the new sector will still have unused space available for future block container writes.

In action 913, the new sector is identified as "active" sector and in action 915, the old sector is erased for future use. The flow chart ends in action 917.

The following description illustrates an example of the above described algorithm ((cf. FIGS. 7 and 8).

Assume, the payload portion comprises five payload parts with the size of a byte and is used to represent a data value of 8-bits. The payload portion could be described as a payload bytes array.

Assume the content of the payload bytes array is:

$0_{4,7}$ $1_{4,6}$ $0_{4,5}$ $0_{4,4}$ $0_{4,3}$ $0_{4,2}$ $0_{4,1}$ $0_{4,0}$ $1_{3,7}$ $1_{3,6}$ $0_{3,5}$ $0_{3,4}$ $0_{3,3}$ $1_{3,2}$ $0_{3,1}$ $0_{3,0}$ $1_{2,7}$ $1_{2,6}$ $0_{2,5}$ $1_{2,4}$ $0_{2,3}$ $1_{2,2}$ $1_{2,1}$ $0_{2,0}$ $1_{1,7}$ $1_{1,6}$ $0_{1,5}$ $1_{1,4}$ $0_{1,3}$ $1_{1,2}$ $1_{1,1}$ $0_{1,0}$ $1_{0,7}$ $1_{0,6}$ $0_{0,5}$ $1_{0,4}$ $1_{0,3}$ $1_{0,2}$ $1_{0,1}$ $1_{0,0}$

When using equation (1) the payload bytes array above represents a byte value
$B_{output}=143_{dec}=10001111_{bin}=1_7 0_6 0_5 0_4 1_3 1_2 1_1 1_0$ This operation corresponds to the action reading the stored payload data from the payload portion of a container and calculate the modulo sum of the current payload bytes (action 703 in FIG. 7).

Figure 11:
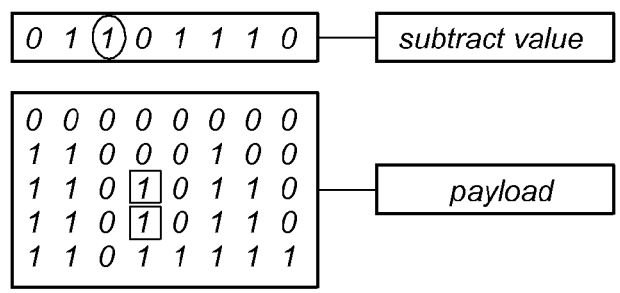
Figure 12:
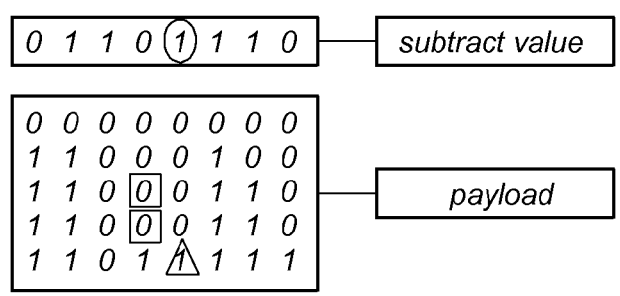

Assume that the new data value to be stored is:
$B_{new}=33_{dec}=00100001_{bin}=0_7 0_6 1_5 0_4 0_3 0_2 0_1 1_0$ The FIGS. 10, 11 and 12 illustrate an example of the above described algorithm (cf. FIG. 8) for bits in the positions 5, 4 and 3 in the bytes of the above payload bytes array with 5 bytes payload parts.

Figure 10:
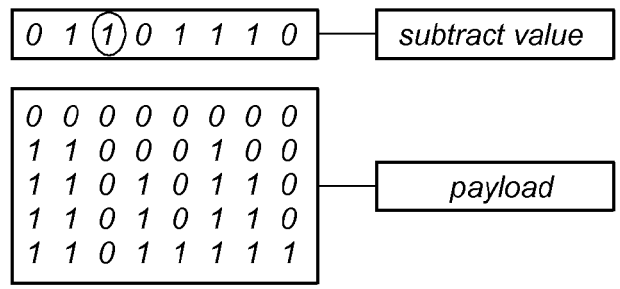
FIGS. 10, 11 and 12 show an example of carrying out the protocol of FIG. 8.

FIG. 10 indicates that the subtract binary value $B_{subtract}$ in this example is:
$0_7 1_6 1_5 0_4 1_3 1_2 1_1 0_0$
and has been obtained by the equation:

$$B_{subtract}=B_{output}-B_{new}=143-33=100$$

The equation is performed by action 705 in FIG. 7. Subsequently by action 707 the new content of the payload bytes array is calculated by subtracting the subtract value $B_{subtract}$ from the content of the present payload bytes array.

Assume that the bit 16 of the subtract binary value $B_{subtract}$ has already been subtracted from one of the five bytes, e.g., $b_{input,4,6}$ from input byte $B_{input,4}$. Then, the content of the payload bytes array is:

$$0_{4,7}\ 0_{4,6}\ 0_{4,5}\ 0_{4,4}\ 0_{4,3}\ 0_{4,2}\ 0_{4,1}\ 0_{4,0}$$

$$1_{3,7}\ 1_{3,6}\ 0_{3,5}\ 0_{3,4}\ 0_{3,3}\ 1_{3,2}\ 0_{3,1}\ 0_{3,0}$$

$$1_{2,7}\ 1_{2,6}\ 0_{2,5}\ 1_{2,4}\ 0_{2,3}\ 1_{2,2}\ 1_{2,1}\ 0_{2,0}$$

$$1_{1,7}\ 1_{1,6}\ 0_{1,5}\ 1_{1,4}\ 0_{1,3}\ 1_{1,2}\ 1_{1,1}\ 0_{1,0}$$

$$1_{0,7}\ 1_{0,6}\ 0_{0,5}\ 1_{0,4}\ 1_{0,3}\ 1_{0,2}\ 1_{0,1}\ 1_{0,0}$$

Moreover, assume at this moment the bit $b_{subtract,\ j}$ in the $B_{subtract}$ is 15 as indicated with a circle in FIG. 10. There is no bit of $b_{input,\ i,5}$ with a value of '1' left in the payload byte series (payload byte series only has $0_{4,5}\ 0_{3,5}\ 0_{2,5}\ 0_{1,5}\ 0_{0,5}$) according to action 805.

In FIG. 11, in accordance with action 807, there are two bits with value of '1' $b_{input,\ 2,4}$ and $b_{input,\ 1,4}$ in position 4 from the payload byte array. Thus the payload byte array subtracts the value '1' from $b_{input,\ 2,4}$ and $b_{input,\ 1,4}$ ($1_{2,4}$ and $1_{1,4}$) which are indicated with a rectangle, according to action 811.

In FIG. 12, the $b_{input,\ 2,4}$ and $b_{input,\ 1,4}$ are already changed into $0_{2,4}$ and $0_{1,4}$ which are noted with the rectangles. At this moment the bit $b_{subtract,\ j}$ in the $B_{subtract}$ is $1_3$ as indicated with a circle in FIG. 12. According to action 811, the payload byte array subtracts $b_{input,\ 0,3}$, i.e. $1_{0,3}$ which is indicated with a triangle.

After this, the $1_2$ and $1_1$ bits have to be subtracted too to finish the algorithm. This is not shown in the figures anymore. However, from FIG. 12 it is evident that these actions can be performed since the corresponding bits $b_{input,\ 0,2}$ and $b_{input,\ 0,1}$ both have a value "1".

After subtracting the subtract value $B_{subtract}$ from the actual content of the payload bytes array, the content of the new payload bytes array to be stored in the memory is:

$$0_{4,7}\ 0_{4,6}\ 0_{4,5}\ 0_{4,4}\ 0_{4,3}\ 0_{4,2}\ 0_{4,1}\ 0_{4,0}$$

$$1_{3,7}\ 1_{3,6}\ 0_{3,5}\ 0_{3,4}\ 0_{3,3}\ 0_{3,2}\ 0_{3,1}\ 0_{3,0}$$

$$1_{2,7}\ 1_{2,6}\ 0_{2,5}\ 0_{2,4}\ 0_{2,3}\ 1_{2,2}\ 0_{2,1}\ 0_{2,0}$$

$$1_{1,7}\ 1_{1,6}\ 0_{1,5}\ 0_{1,4}\ 0_{1,3}\ 1_{1,2}\ 1_{1,1}\ 0_{1,0}$$

$$1_{0,7}\ 1_{0,6}\ 0_{0,5}\ 1_{0,4}\ 0_{0,3}\ 1_{0,2}\ 1_{0,1}\ 1_{0,0}$$

When applying equation (1) to the new payload bytes array one can calculate the data value $B_{output}$ that is represented by said payload portion is:

$B_{output}=33_{dec}=00100001_{bin}=0_7\ 0_6\ 1_5\ 0_4\ 0_3\ 0_2\ 0_1\ 1_0$

This value of $B_{out}$ indeed corresponds to the new value $B_{new}$ to be stored.

The algorithm given above has the characteristic that it determines whether the payload bytes array comprises a combination of bits $b_{input,\ i,j}$ with a value "1", wherein $b_{input,\ i,j}$="1" represents a value $2^j$, which summation of values it represents equals to $B_{subtract}$. If there is such a combination, the payload portion could be used to store the new value $B_{new}$. The combination of bits $b_{input,\ i,j}$ is set to "0", is programmed state, when writing the payload bytes array in the payload portion of the block container.

As $b_{input0j}$, $b_{input1j}$, $b_{input2j}$, $b_{input3j}$, $b_{input4j}$ with a value "1" all represent the same value $2^j$, it is clear to the person skilled in the art the that any of the bits with value "1" in the $j^{th}$ column of the payload bytes array could be changed from the erased state "1" to the programmed state "0". This has the advantage that if there is a row in the payload bytes array which comprises bits with a value "1" at all corresponding bit positions of $B_{subtract}$ having a value "1", only said row, i.e. payload part in the form of a byte, has to be programmed to store the new data value in the payload portion of the block container.

Figure 13:
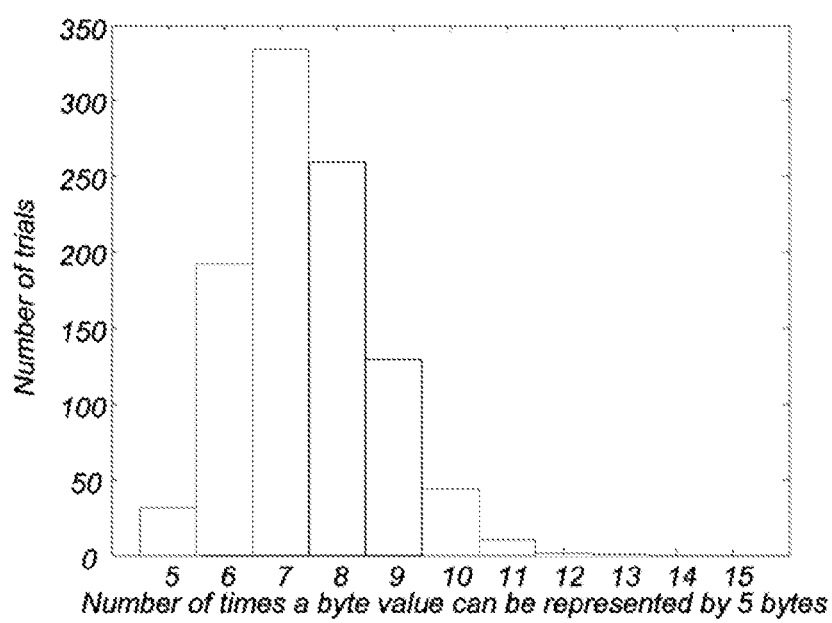
FIG. 13 is a statistic diagram of the protocol showing the number of times a data value can be represented by 5 bytes.

This algorithm has been tested in MATLAB®. A thousand trials have been done where random bytes are written to a 5 byte erased (every byte=0xFF) payload. The number of times a byte could be written to the block container 35 before being full was recorded (i.e. no '1' bits available to create the correct modulo sum value). FIG. 13 shows the number of trials (Y-axis) in which a certain number of byte values could be represented by 5 bytes (X-Axis) using the mentioned algorithm. On average 7.50 bytes could be programmed into a payload of 5 bytes. This further increases the efficiency of the byte wise programmable emulation.

In another embodiment of the invention, an XOR operation is performed on the corresponding bits $b_{input,\ i,j}$ of the payload parts instead of the sum operation in the example given above, to calculate the data value from the payload portion. In this embodiment instead of $B_{subtract}$ a value $B_{diff}$ is determined wherein:

$B_{diff}=B_{output}XORB_{new}$

The action 707, subtract the subtract value from the payload portion, is now replaced with an operation wherein for each bit $b_{diff,\ j}$ with value "1", it is checked, whether there is any bit $b_{input,\ i,j}$ with a value of '1' in the position j left in the payload byte array of the payload portion. If so, the algorithm changes the corresponding bit in the payload byte array from a '1' in to a '0'. If not, the present payload portion could not be used to store a new data value $B_{new}$. This operation if for each bit $b_{diff,\ j}$ with value '1' a corresponding bit with value '1' could be found, results in a payload portion which results in a $B_{output}$ with XOR operation, which is equal to $B_{new}$.

In another embodiment of an algorithm according to the invention, it is assumed that a bit of the payload portion in the erased state represents a bit value '0' and a bit in the programmed state represents a bit value '1'. The data value ($B_{out}$) that is stored in the payload portion is calculated by modulo summation of the current payload parts, which is similar to action 703 in FIG. 7. Subsequently, a parameter $B_{add}$ is calculated which value corresponds to the following formula:

$B_{add}=B_{new}-B_{out}$ wherein $B_{new}$ is the new data value to be stored in the payload part. This formula replaces the action performed in action 705 of FIG. 7.

In this embodiment action 707 in FIG. 7 is replaced by adding the value $B_{add}$ to the payload portion.

An advantage of this embodiment is that when the payload portion is used for the first time, is represents a data value '0'. To store a first data value (byte) in the memory, there is no need to perform the actions 703 and 705 and action 707 is writing the first data value in a payload portion (byte).

For changing the payload portion to represent a second data value, in action 705, a value for $B_{add}$ is calculated, and in action 707, a payload portion with only '0' bits has to be found in the payload portion and in only said portion has to be programmed with $B_{add}$. This can be repeated for new data values to be stored in the payload portion until all payload portions have been written once.

After this, an algorithm having a similar structure as shown in FIG. 8 is used to determine whether the payload portion comprises a combination of bits in the erased state with value '0', which sum of values which each bit represents in the payload portion equals to $B_{add}$. If such a combination of bits can be found, said bits are changed from the erased state representing a value '0' to the programmed state representing a value '1', an thus performing the operation to add the value of $B_{add}$ to the payload portion. The payload portion can be used to store a new data value as long as such a combination of bits can be found in the payload portion.

Figure 3:
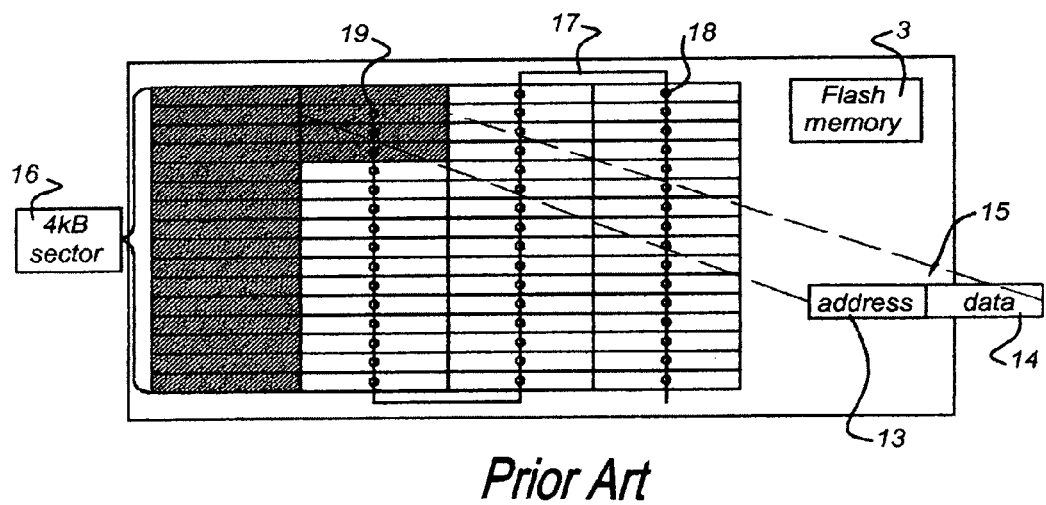
FIG. 3 is an example of a prior art FLASH memory organized as a stack memory.

It is observed that for storing the block containers 35 of the present invention any suitable memory organization can be used, including the stack organization as explained with reference to FIG. 3. However, advantageously a pointer based organization can be used as will be explained now with reference to FIGS. 4a, 4b.

Figure 4A:
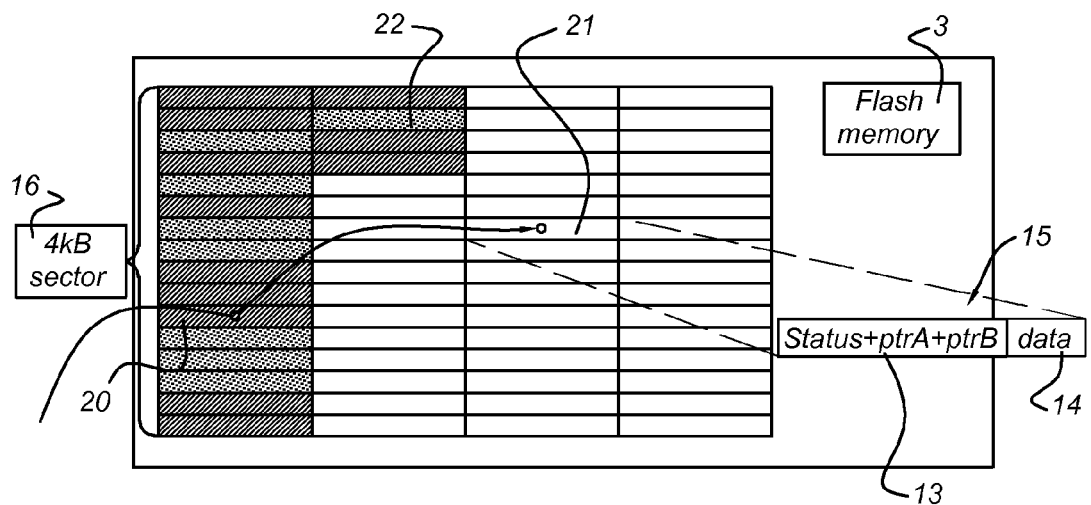
FIGS. 4a, 4b are examples of a FLASH memory organized as a pointer based memory.
Figure 4B:
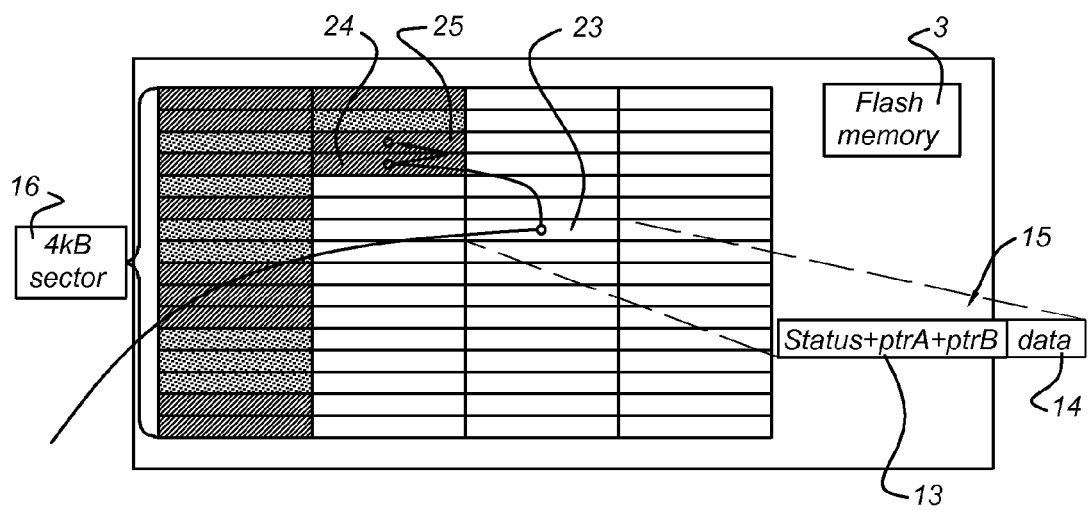

FIGS. 4a and 4b show examples of how this algorithm may work. Every address for the emulated EEPROM is mappable to the FLASH memory 3 via a predefined function. Using such a predefined function means that the system will jump to a predefined unique physical address (or container 15) in the FLASH memory 3 while trying to access a corresponding emulated EEPROM byte. The container 15 at the physical address corresponding to the emulated EEPROM address may or may not contain valid data. The data is valid if the container 15 has been written with the latest data corresponding to the emulated EEPROM byte. The data is invalid if for instance the container 15 may not have been written at all or the container 15 has been overwritten by data corresponding to another emulated EEPROM byte. This may happen if the original container 15 for another EEPROM byte was already full and the next consecutive free container was the container 15 corresponding to the target emulated EEPROM byte.

By using a header 13 with a status field, a pointer A and a pointer B for each container 15, the status of each container 15 is clear to the system and valid data will always be traceable:

The status field contains information regarding the status of the container 15. It may include status data indicating either one of:
Container is empty
Container does not contain valid data, follow pointer B address offset
Container was full, new container allocated at pointer A address offset
Container contains valid data for the corresponding emulated EEPROM byte
Pointer PtrA address offset:
Indicates at which offset address a new container has been allocated
Pointer PtrB address offset:
Indicates at which offset address a new container has been allocated When a container 15 contains data corresponding to the emulated EEPROM byte, but the container 15 is full and another container 15 has been allocated to write new data corresponding to the emulated EEPROM byte, pointer A is used to indicate at which address offset the new container 15 is stored. When a container 15 does not contain data corresponding to the emulated EEPROM byte (i.e. it has been used as a new container 15 for another emulated EEPROM byte) pointer B is used to indicate where the first container is stored which contains corresponding data. Since a container 15 may contain invalid data (pointer B used to indicate corresponding container 15) and may be full (pointer A indicates where the next allocated container 15 is), both pointers are a necessity.

With reference to FIG. 4a, assume a container stored at address 20 and a container stored at address 21 represent the same payload byte 14. Container at address 20 contains old information and container at address 21 contains new information. If the total amount of memory allocated in FLASH memory 3 to emulate the EEPROM functionality is eight times larger than the EEPROM memory 4, the predefined function to calculate the first physical FLASH address could be to multiply the associated EEPROM address by 8. In an active sector 16 the emulated EEPROM address "2" would, then, be associated with physical address 2×8="16" in the FLASH sector 16. Assume that this corresponds to the container at address 20 in FLASH memory 3. The container at address 20 has been previously written and new data has been written in the container at address 21. The system retrieves this status information from the container header 13 of the container at address 20 and retrieves the address offset from pointer ptrA. The new physical FLASH address is then calculated as 16+pointer ptrA value. This causes the system to jump to the container at address 21 and retrieve it. Since the container at address 21 contains corresponding valid data, as can be checked from the status in container header 13, the data retrieval has only taken two jumps and correspondingly two container reads.

FIG. 4b shows an example where the container does not contain data corresponding to the emulated EEPROM byte. The system first determines the predefined physical FLASH address corresponding to the emulated EEPROM byte. This address has been indicated with reference number 23. It then reads the container 15 from address 23 and sees in the container header 13 the container 15 has been used by another emulated EEPROM byte (see previous example where the first container corresponding to the emulated EEPROM byte was full). Furthermore, it reads in the container header 13 that there is a new container which does contain data corresponding to the emulated EEPROM byte. It uses pointer ptrB to jump to that container which is stored at address 23+ptrB. This latter address is indicated with reference number 24. When reading the next container from address 24, the system establishes that this container does contain data corresponding to the emulated EEPROM byte, but the container was filled and a new container has been allocated to store new data. The system then uses pointer ptrA from the header 13 from the container at address 24 to jump to that container which is stored in address 24+ptrA. This latter address is indicated with reference number 25. The system, then, retrieves the desired data from address 25. In this example, the number of container reads to retrieve the desired data is three.

The essence of the pointer based addressing scheme is that by using a more complex addressing scheme and more overhead in the container header the number of reads before locating the correct container can be drastically reduced. The invention drastically reduces the overhead per container, thus allowing the use of a bit more overhead to incorporate an advanced addressing scheme while still improving data retention performance.

It is observed that the pointer based addressing scheme may equally well be applied in prior art emulated memory schemes, including the one explained with reference to FIGS. 1 and 2. So, in accordance with this aspect of the invention, the container format based on a pointer addressing scheme may comprise one or more payload values.

Figure 14A:
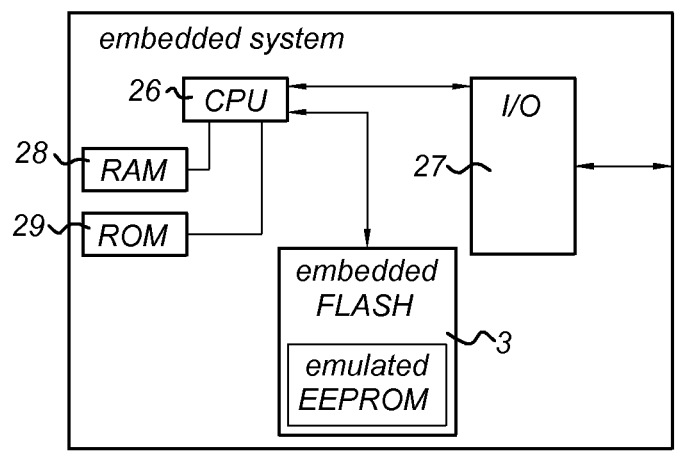
FIGS. 14*a*, 14*b* and 15 show embodiments of implementations of the present invention.
Figure 14B:
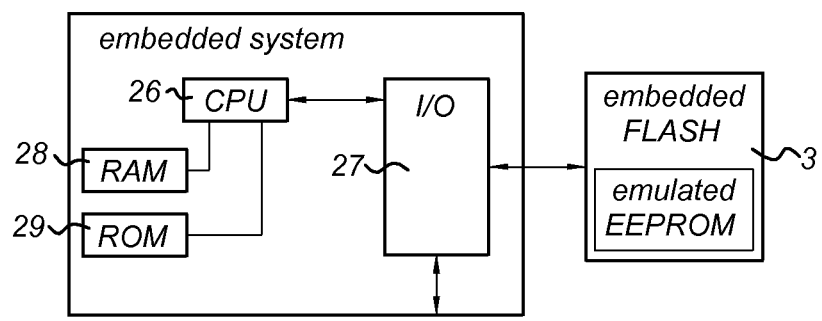

FIGS. 14a and 14b schematically show typical examples where the emulated EEPROM can be used for cost optimization in removing the EEPROM completely.

FIG. 14a shows an example of an embedded system with an internal (embedded) FLASH memory 3 emulating an EEPROM. The embedded system comprises a central processing unit (CPU) 26 connected to the embedded FLASH memory 3, as well as an I/O unit 27 connected to the CPU. The I/O unit is arranged to communicate with other devices. Typically the CPU will comprise a processor and a ROM 29 and a RAM 28. The ROM 29 contains a software program to allow the processor to perform the algorithm as explained above. The RAM 28 is used for buffering data as the case may be.

FIG. 14b shows an alternative embodiment. The same reference signs refer to the same components as in FIG. 14a. The difference with FIG. 14a is that, in FIG. 14b, the FLASH memory 3 is located outside the embedded system.

Figure 15:
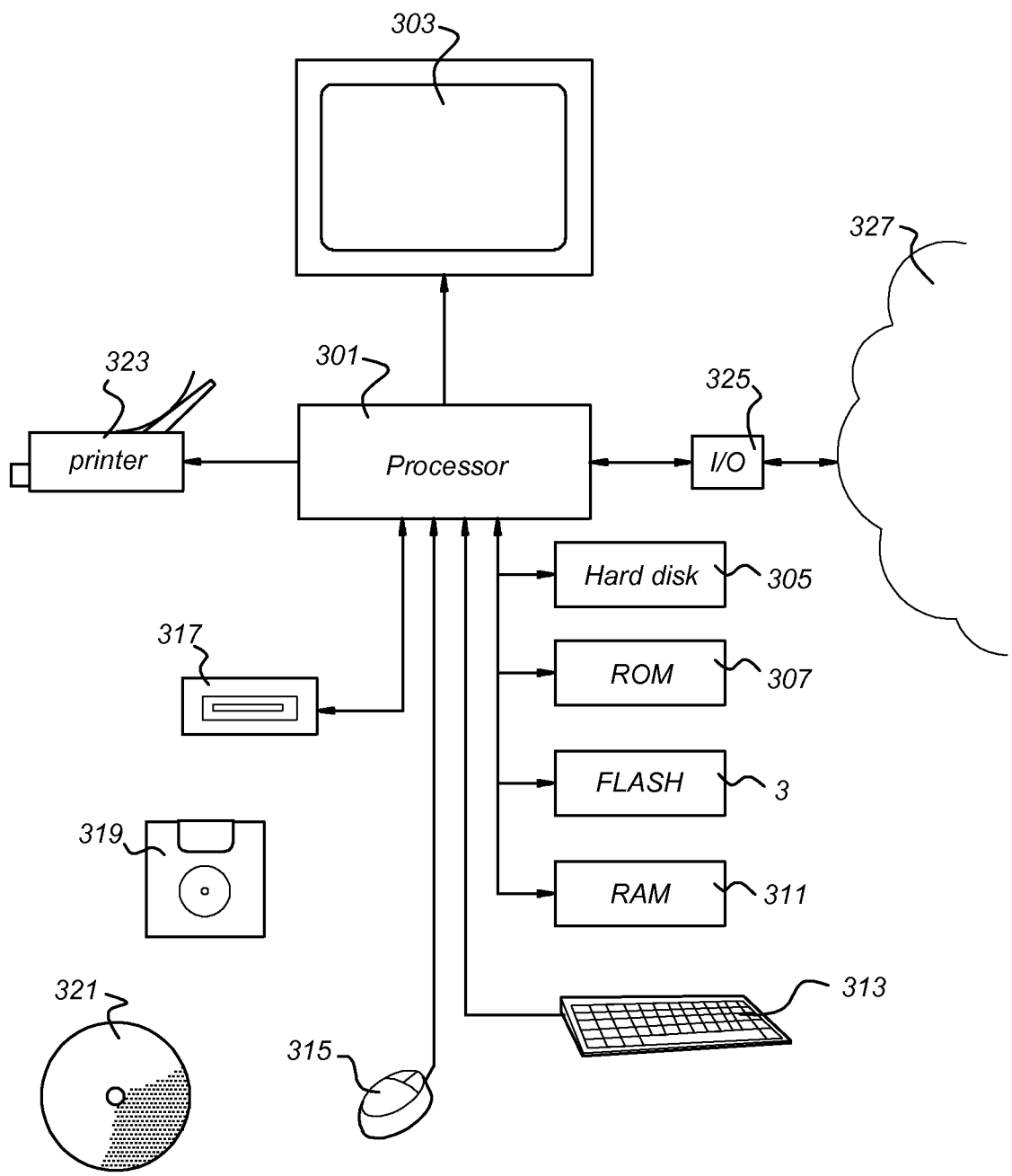

However, the present invention can also be applied in other types of computer systems where one wishes to implement an emulated EEPROM. In FIG. 15, an overview is given of a computer arrangement that can be used to carry out the function scheme according to the invention. The arrangement comprises a processor 301 for carrying out arithmetic operations.

The processor 301 is connected to a plurality of memory components, including a hard disk 305, Read Only Memory (ROM) 307, FLASH memory 3, and Random Access Memory (RAM) 311. Not all of these memory types need necessarily be provided. Moreover, these memory components need not be located physically close to the processor 301 but may be located remote from the processor 301. FLASH memory 3 emulates EEPROM.

The processor 301 is also connected to units for inputting instructions, data etc. by a user, like a keyboard 313, and a mouse 315. Other input units, such as a touch screen, a track ball and/or a voice converter, known to persons skilled in the art may be provided too.

A reading unit 317 connected to the processor 1 is provided. The reading unit 317 is arranged to read data from and possibly write data on a physical data carrier like a floppy disk 319 or a CDROM 321. Other data carriers may be tapes, DVD, Blu Ray disks, memory sticks, etc. as is known to persons skilled in the art. The data carrier may be provided with a computer program product comprising instructions and data arranged to be read by the processor 301 and, after being read, allowing the processor 301 to perform a method in accordance with the invention. Such a computer program product may then be loaded in one of the memory components 305, 307, 311. However, such computer program product may, alternatively, be downloaded via a telecommunication network 327.

The processor 301 may be connected to a printer 323 for printing output data on paper, as well as to a display 303, for instance, a monitor or LCD (Liquid Crystal Display) screen, a plasma display panel, or any other type of display known to persons skilled in the art.

The processor 301 may be connected to the communication network 327, for instance, the Public Switched Telephone Network (PSTN), a Local Area Network (LAN), a Wide Area Network (WAN), the Internet, etc. by means of an I/O unit 325. The processor 301 may be arranged to communicate with other communication arrangements through the network 327.

The processor 301 may be implemented as stand alone system, or as a plurality of parallel operating processors each arranged to carry out subtasks of a larger computer program, or as one or more main processors with several sub-processors. Parts of the functionality of the invention may even be carried out by remote processors communicating with processor 301 through the network 327.

An advantage of the present invention is that a payload portion comprising P smaller payload parts could be used to store more than once the same data value. For example, a data value "A" could be stored first in the payload portion and is represented by payload value "$A_1$". Subsequently a data value "B" is stored in the payload portion and is represented by payload value "$B_1$". Hereafter, data value "A" should again be stored in the payload portion. A new payload value "$A_2$" is calculated in dependence of the data value "A" and the payload value "$B_1$", which is subsequently stored in the payload portion. A characteristic of the present invention is that for each storage of a subsequent data value, one or more bits are additionally changed from an erased state to a programmed state. This process can be repeated until the moment that it is not possible to change one or more bits from the erased state into the programmed state such that the payload portion could represent the data value to be written in the payload portion.

The algorithms and protocol described before can be running on such a computer arrangement.

In its broadest aspect, the present invention relates to a method of emulating a byte-wise programmable memory in a sector-wise erasable memory (3), comprising:
 a) dividing said sector-wise erasable memory in a plurality of sectors (36);
 b) dividing each of said sectors into a plurality of memory locations suitable to store containers (35), each container (35) having a header (33) and a payload portion (34); and
 c) storing a data value relating to an application in said payload portion (34) of one of said containers (35) and header information in said header (33) in an available container,
characterized by said containers being block containers, said data portion comprising two or more payload values and said storing said data value in said payload portion (34) is performed in such a way that said two or more payload values in said payload portion (34) together uniquely represent said data value.

The invention also relates to a system comprising a central processing unit arranged to perform such a method.

In a further aspect the invention relates to a computer program product comprising data and instructions, said computer program being arranged to be loaded by such a system, and after being loaded providing said central processing unit with the capacity to perform the method.

In a still further aspect, the invention relates to a data carrier comprising such a computer program product.

What is claimed is:
1. A method of emulating a byte-wise programmable memory in a sector-wise erasable memory comprising:
 a) dividing said sector-wise erasable memory into a plurality of sectors;
 b) dividing each of said sectors into a plurality of memory locations, each memory location defining a container, each container being arranged to store a header and a payload portion; and
 c) storing a P bits data value relating to an application in said payload portion of one of said containers and header information in said one of said containers,
 wherein said containers comprise block containers, said payload portion comprises M-bits, wherein M>P, and said storing said P-bits data value in said payload portion is performed in such a way that said M-bits payload portion represents said P-bits data value in a unique way and said storing of said P-bits comprises the following actions:
 c1) reading stored payload data from the payload portion of a container and deriving a stored data value relating to said application by performing an arithmetic function on said read stored payload data;
 c2) calculating new payload data in dependence on the data value to be stored and the stored data value, such that said data value to be stored can be derived from said new payload data by performing said arithmetic function on said new payload data; and c3) storing the new payload data in the payload portion of said container.

2. The method according to claim 1, wherein said sector-wise erasable memory is a FLASH memory.

3. The method according to claim 1, wherein the payload portion comprises two or more payload parts, wherein each payload part has a number of bits which equals P.

4. The method according to claim 1, wherein said arithmetic function is at least one of a SUM, EXOR, XOR and AND function.

5. The method according to claim 1, wherein said deriving said stored data value in action c1) comprises:
c11) calculating said stored data value as a current modulo sum of all said two or more payload parts in said payload portion, and said calculating action in action c2) comprises:
c21) calculating a subtract value such that said subtract value is equal to a difference between said current modulo sum, i.e. said stored data value, and said data value to be stored; and
c22) subtracting said subtract value from said two or more payload parts in accordance with a predetermined subtract scheme to render said new payload data.

6. The method according to claim 5, wherein there are at least five payload parts, and said predetermined subtract scheme comprises, that for every bit in a bit position in said subtract value:
c221) checking whether the bit has a value of '1'; if the checking is negative, jumping to the next bit in the subtract value; if the checking is positive, continuing with next action;
c222) checking whether there is any bit with a value of '1' in the same bit position in the at least five payload parts;
c2221) if so, subtracting a value of '1' of said bit in said same bit position from said payload part identified in step c222;
c2222) if no, checking if there are any two bits with a value of '1' in a next bit position from the at least five payload parts;
c22221) if so, subtracting two times a value of '1' from two payload parts identified in step c2222;
c22222) if no, checking if there are any four bits with a value of '1' in a next bit position;
c222221) if so, subtracting four times a value of '1' from four payload parts identified in step c22222;
c222222) if no, if there are enough payload parts, continuing this process four eight, sixteen, etc. bits in next bit positions until there are not enough payload parts anymore and, then, identifying a free block container and storing said data value in said free block container.

7. The method according to claim 6, comprising, when no such free block container can be identified in a sector in which said block container is stored, defragmenting said sector and then identifying a free block container anew.

8. The method according to claim 7, wherein said defragmenting comprises:
reading all block containers in said sector one-by-one in reverse order;
checking for each block container whether payload data in said block container is valid data, and
ignoring each block container having no valid data in its payload data,
storing said payload container in a local memory buffer if said payload data is valid; writing content of said local memory buffer to a new sector in said FLASH memory; setting said new sector in an active status; and
erasing said sector.

9. The method according to claim 1, wherein consecutive available containers are determined based on one of a stack organization and a pointer based organization.

10. The method according to claim 1, wherein each data value, payload part, and subtract value is a byte of eight bits.

11. A system comprising:
a sector-wise erasable memory; and
a central processing unit connected to said sector-wise erasable memory to perform the method as claimed in claim 1.

12. The system according to claim 11, said system being an embedded system, having either an internal or an external sector-wise erasable memory emulating said byte-wise programmable memory.

13. The system according to claim 12, wherein said sector-wise erasable memory is a FLASH memory.

14. A computer program product comprising data and instructions, said computer program being arranged to be loaded by a system according to claim 11 and stored on a non-transient tangible medium, and after being loaded providing said central processing unit with the capacity to perform the method according to claim 1.

15. A data carrier comprising a computer program product as claimed in claim 14 wherein said data carrier is a non-transient tangible storage medium.

16. The method according to claim 1, comprising:
a) dividing said sector-wise erasable memory into a plurality of sectors;
b) dividing each of said sectors into a plurality of memory locations, each of said plurality of memory locations defining a container, each container having a header and a payload portion;
c) storing a data value relating to an application in said payload portion of one of said containers and header information in said header in an available container; and
d) dividing said header into a status field, a first pointer address offset indicating at which offset address a new container has been allocated for a data value related to said application when said status field indicates that said container is fall, and a second pointer address offset indicating at which offset address a new container has been allocated for a data value related to said application when said status field indicates that said container contains invalid data.

17. The method according to claim 16, wherein the method comprises:
a) retrieving header information from a container in said sector-wise erasable memory associated with said application;
b) retrieving status information from said status field, and
i. if said status field indicates that the container contains valid data, retrieving said data value;
ii. if said status field indicates that the container is full, using said first pointer address offset present in said header to calculate a first offset address, jumping to said first offset address and retrieving said data value from said first offset address; and
iii. if said status field indicates that the container contains invalid data, using said second pointer address offset present in said header to calculate a second offset address, jumping to said second offset address and retrieving said data value from said second offset address.

18. A method of emulating a byte-wise programmable memory in a sector-wise erasable memory, comprising:
    a) dividing said sector-wise erasable memory into a plurality of sectors;
    b) dividing each of said sectors into a plurality of memory locations suitable to store containers, each container having a header and a payload portion; and
    c) storing a data value relating to an application in said payload portion of one of said containers and header information in said header in an available container,
    wherein said header comprises a status field, and at least one pointer address offset indicating at which offset address a new container has been allocated.

19. A system comprising a processor arranged to perform the method according to claim 18.

20. A system comprising:
    a central processing unit; and
    a sector-wise erasable memory connected to said central processing unit, wherein said sector-wise erasable memory emulates a byte-wise programmable memory
    wherein said central processing unit is capable of performing the following steps:
        dividing said sector-wise erasable memory into a plurality of sectors, wherein each of said sectors is divided into a plurality of memory locations, each memory location defining a container, each container being arranged to store a header and a payload portion; and
        storing a data value equal to the output of an arithmetic function which has said payload portion as an input to said arithmetic function.

21. The system according to claim 20 wherein said storing data value further comprises:
    storing a P bits data value relating to an application in said payload portion of one of said containers and header information in said one of said containers, wherein:
    said containers comprise block containers; and
    said payload portion comprises M-bits, wherein M>P, and wherein said M-bits payload portion represents said P-bits data value in a unique way and said storing of said P-bits comprises the following actions:
        1) reading stored payload data from said payload portion of a container and deriving a stored data value relating to said application by performing said arithmetic function on said read stored payload data;
        2) calculating new payload data in dependence on said data value to be stored and the stored data value, such that said data value to be stored can be derived from said new payload data by performing said arithmetic function on said new payload data; and
        3) storing said new payload data in said payload portion of said container.

22. The system according to claim 21, wherein said arithmetic function is at least one of a SUM, EXOR, XOR and AND function.

23. The system according to claim 20 wherein said central processing unit comprises a processor and further comprises:
    a read-only memory; and
    a random-access memory.

24. The system according to claim 20 wherein said sector-wise erasable memory is a FLASH memory.

25. The system according to claim 20, said system being an embedded system, having either an internal or an external sector-wise erasable memory emulating said byte-wise programmable memory.

26. The system according to claim 20 further comprising:
    memory components connected to said central processing unit;
    units for inputting instructions; and
    units for reading data from and writing data to physical data carriers.

* * * * *